(12) United States Patent
Lyons

(10) Patent No.: US 7,608,855 B2
(45) Date of Patent: Oct. 27, 2009

(54) POLYMER DIELECTRICS FOR MEMORY ELEMENT ARRAY INTERCONNECT

(75) Inventor: Christopher F. Lyons, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 1067 days.

(21) Appl. No.: 10/817,467

(22) Filed: Apr. 2, 2004

(65) Prior Publication Data

US 2005/0224922 A1 Oct. 13, 2005

(51) Int. Cl.
*H01L 29/08* (2006.01)
*H01L 35/24* (2006.01)
*H01L 51/00* (2006.01)

(52) U.S. Cl. .................. 257/40; 257/642; 257/643; 257/E51.005

(58) Field of Classification Search ............... 257/642, 257/643, 700, 759, 40, E39.007, E51.001–E51.052
See application file for complete search history.

(56) References Cited

U.S. PATENT DOCUMENTS

| | | | |
|---|---|---|---|
| 4,663,270 A | 5/1987 | Potember et al. | |
| 5,589,692 A | 12/1996 | Reed | |
| 6,055,180 A | 4/2000 | Gudesen et al. | |
| 6,208,553 B1 | 3/2001 | Gryko et al. | |
| 6,212,093 B1 | 4/2001 | Lindsey | |
| 6,272,038 B1 | 8/2001 | Clausen et al. | |
| 6,314,019 B1 | 11/2001 | Kuekes et al. | |
| 6,320,200 B1 | 11/2001 | Reed et al. | |
| 6,324,091 B1 | 11/2001 | Gryko et al. | |
| 6,348,700 B1 | 2/2002 | Ellenbogen et al. | |
| 6,541,816 B2 | 4/2003 | Ramsbey et al. | |
| 6,555,436 B2 | 4/2003 | Ramsbey et al. | |
| 6,656,763 B1 * | 12/2003 | Oglesby et al. | ............... 438/99 |
| 6,838,764 B2 * | 1/2005 | Farrar | ......................... 257/700 |
| 6,955,939 B1 * | 10/2005 | Lyons et al. | ................... 438/82 |
| 2003/0173612 A1 | 9/2003 | Krieger et al. | |
| 2003/0234428 A1 | 12/2003 | Schmid et al. | |

FOREIGN PATENT DOCUMENTS

| | | |
|---|---|---|
| WO | WO 01/073845 | 10/2001 |
| WO | WO 03/107426 | 12/2003 |
| WO | WO 2004/015778 | 2/2004 |
| WO | WO 2004/053930 | 6/2004 |

OTHER PUBLICATIONS

International Search Report for International Application No. PCT/US2005/004680, Jan. 4, 2006.

* cited by examiner

*Primary Examiner*—Monica Lewis
(74) *Attorney, Agent, or Firm*—Turocy & Watson, LLP

(57) ABSTRACT

Disclosed are semiconductor devices containing a polymer dielectric and at least one active device containing an organic semiconductor material and a passive layer. Also disclosed are semiconductor devices further containing a conductive polymer. Such devices are characterized by light weight and robust reliability.

20 Claims, 3 Drawing Sheets

POLYMER DIELECTRICS FOR MEMORY ELEMENT ARRAY INTERCONNECT

TECHNICAL FIELD

The present invention generally relates to integrated circuit chips with polymer dielectrics. More particularly, the present invention relates to polymer dielectrics as memory element interconnects in organic memory devices.

BACKGROUND ART

The basic functions of a computer and memory devices include information processing and storage. In typical computer systems, these arithmetic, logic, and memory operations are performed by devices that are capable of reversibly switching between two states often referred to as "0" and "1." Such switching devices are fabricated from semiconducting devices that perform these various functions and are capable of switching between two states at high speed.

Electronic addressing or logic devices, for instance for storage or processing of data, are made with inorganic solid state technology, and particularly crystalline silicon devices. The metal oxide semiconductor field effect transistor (MOSFET) is one the main workhorses.

Much of the progress in making computers and memory devices faster, smaller and cheaper involves integration, squeezing ever more transistors and other electronic structures onto a postage stamp sized piece of silicon. A postage stamp sized piece of silicon may contain tens of millions of transistors, each transistor as small as a few hundred nanometers. However, silicon based devices are approaching their fundamental physical size limits.

Inorganic solid state devices are generally encumbered with a complex architecture which leads to high cost and a loss of data storage density. The circuitry of volatile semiconductor memories based on inorganic semiconductor material must constantly be supplied with electric current with a resulting heating and high electric power consumption in order to maintain stored information. Nonvolatile semiconductor devices have a reduced data rate and relatively high power consumption and large degree of complexity.

Moreover, as inorganic solid state device sizes decrease and integration increases, sensitivity to alignment tolerances increases making fabrication markedly more difficult. Formation of features at small minimum sizes does not imply that the minimum size can be used for fabrication of working circuits. It is necessary to have alignment tolerances which are much smaller than the small minimum size, for example, one quarter the minimum size.

Scaling inorganic solid state devices raises issues with dopant diffusion lengths. As dimensions are reduced, the dopant diffusion lengths in silicon are posing difficulties in process design. In this connection, many accommodations are made to reduce dopant mobility and to reduce time at high temperatures. However, it is not clear that such accommodations can be continued indefinitely.

Applying a voltage across a semiconductor junction (in the reverse bias direction) creates a depletion region around the junction. The width of the depletion region depends on the doping levels of the semiconductor. If the depletion region spreads to contact another depletion region, punch through or uncontrolled current flow, may occur.

Higher doping levels tend to minimize the separations required to prevent punch through. However, if the voltage change per unit distance is large, further difficulties are created in that a large voltage change per unit distance implies that the magnitude of the electric field is large. An electron traversing such a sharp gradient may be accelerated to an energy level significantly higher than the minimum conduction band energy. Such an electron is known as a hot electron, and may be sufficiently energetic to pass through an insulator, leading to irreversibly degradation of a semiconductor device.

Scaling and integration makes isolation in a monolithic semiconductor substrate more challenging. In particular, lateral isolation of devices from each other is difficult in some situations. Another difficulty is leakage current scaling. Yet another difficulty is presented by the diffusion of carriers within the substrate; that is free carriers can diffuse over many tens of microns and neutralize a stored charge.

Continuing demand for smaller and lighter electronics has created a need for advanced materials and designs. This is because current trends in electron markets, such as the growing demand for wireless communications and portable computing, are placing an increasing emphasis on smaller/lighter device features and faster operating speeds. To ensure reliable operation of an electronic circuit, proper electrical isolation between adjacent conductors must be achieved. Proper electrical isolation mitigates high voltage arcing and leakage currents, which can be exacerbated at high frequencies. As device density on chips increases, the difficulty in achieving proper electrical isolation also increases.

As the wafer size increases and/or as transistor device size decreases, concerns over the interlayer dielectric material become more important. Current interlayer dielectric materials, such as inorganic oxides and nitrides, have beneficial aspects as well as deficiencies. It is more important to account for certain physical properties, such as unwanted diffusion, crosstalk, adequate insulation (both electrical and temperature), coefficients of thermal expansion, short channel effects, leakage, critical dimension control, drain induced barrier lowering, and the like, when making circuit designs. Mitigating deficiencies of interlayer dielectric materials is desired.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides memory chips and semiconductor chips where the coefficients of thermal expansion of two or more of the plastic substrate, polymer dielectric, conductive polymers, and organic semiconductors are substantially matched thereby mitigating undesirable effects of temperature changes. Moreover, the present invention provides memory chips and semiconductor chips that are relatively light weight and flexible owing to two or more of plastic substrates, polymer dielectrics, conductive polymers, and organic semiconductors.

The polymer dielectrics used in accordance with the present invention have one or more of low dielectric constant, low dissipation factor, low moisture uptake, thermal stability, mechanical stability, high breakdown voltage, and high glass transition temperature. One aspect of the present invention relates to semiconductor devices semiconductor devices containing a polymer dielectric and at least one active device containing an organic semiconductor material and a passive layer. Another aspect of the present invention relates to semiconductor devices further containing a conductive polymer.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

Figure 1:
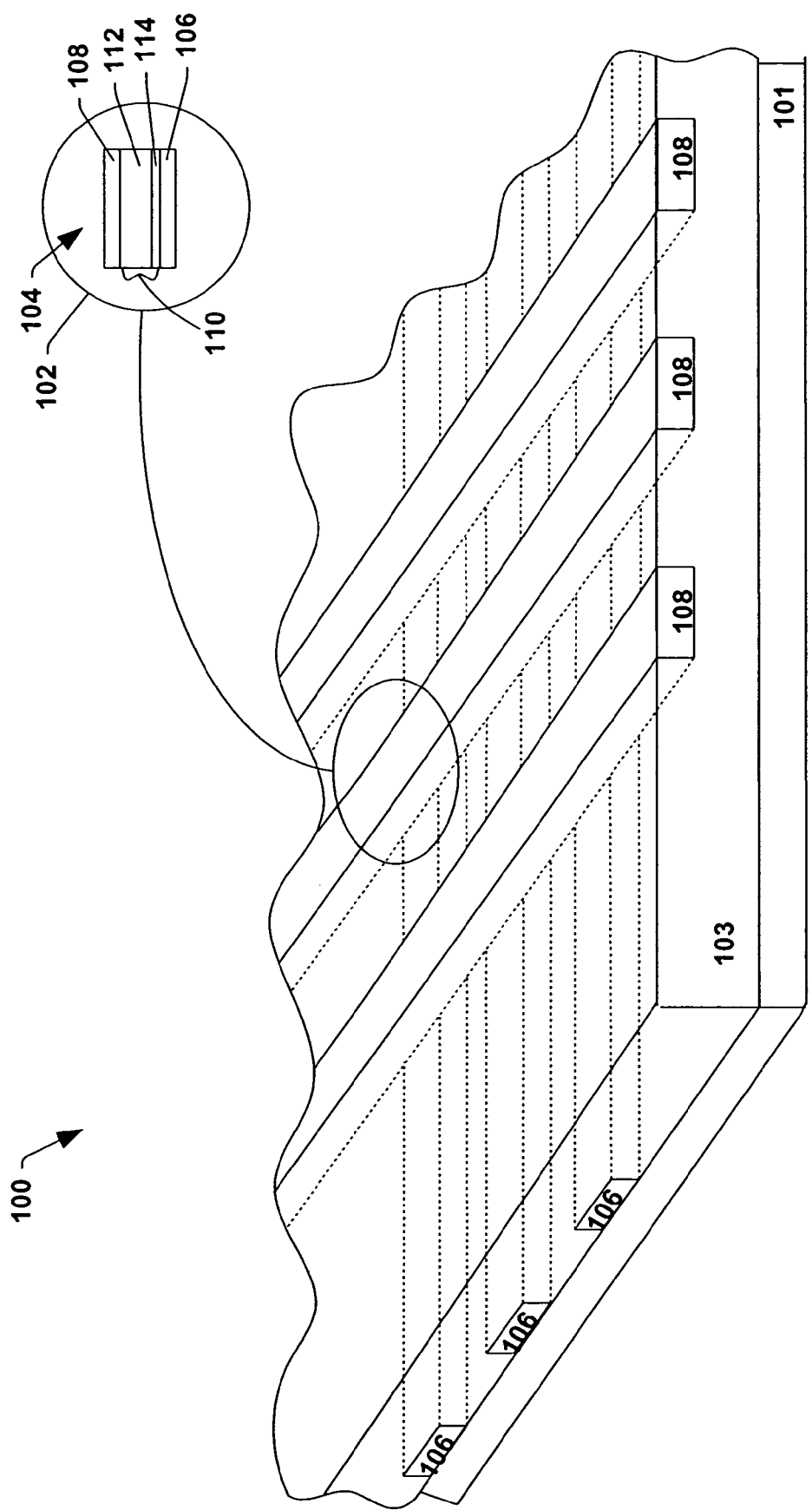
FIG. 1 illustrates a perspective view of a two dimensional microelectronic device containing a plurality of organic memory cells within a polymer dielectric in accordance with one aspect of the invention.

Polymer dielectrics generally have lighter weight and higher coefficients of thermal expansion than inorganic materials commonly employed as semiconductor substrates, such as silica and silicon nitride. The coefficient of thermal expansion is generally defined as the fractional increase in length per unit rise in temperature. The present invention involves using polymer dielectrics in connection with organic semiconductor or polymer memory devices. The present invention also optionally involves using polymer dielectrics with conductive polymers. In this connection, the present invention provides memory chips and semiconductor chips that are light in weight, semiflexible in constitution and where the coefficients of thermal expansion of two or more of the polymer dielectric, conductive polymers, and organic semiconductors are substantially matched.

The integrated circuit chips made in accordance with the present invention contain a polymer dielectric. The polymer dielectric has relatively light weight and a coefficient of thermal expansion that substantially matches many of the materials that formed over the substrate including active devices, particularly active devices made of organic semiconductor or polymer memory cells. Since the dielectric is made of a polymer dielectric, changes in temperature do not deleteriously affect the performance, reliability, and/or mechanical integrity of the integrated circuit chips that contain organic semiconductor or polymer memory devices.

Polymer dielectrics are insulation materials, such as low k materials (a material with a low dielectric constant). Low k materials provide electrical insulation between various layers, devices, structures, and regions within semiconductor substrates. For purposes of this invention, low k materials have a dielectric constant below about 3. In another embodiment, low k materials have a dielectric constant below about 2.4. In yet another embodiment, low k materials have a dielectric constant below about 1.8. In still yet another embodiment, low k materials have a dielectric constant below about 1.5.

The polymer dielectrics may be self-patternable (without the need for a photoresist) or nonself-patternable (requiring the use of a photoresist or mask to be patterned). In some instances, the use of self-patternable polymer dielectrics can eliminate the necessity to perform photolithographic steps in fabricating integrated circuit devices.

General examples of polymer dielectrics include low k polymers and low k fluoropolymers. Examples of polymer dielectric include polyimides, fluorinated polyimides, polysilsequioxanes such as hydrogen polysilsequioxanes, methyl polysilsequioxanes, butyl polysilsequioxanes, and phenyl polysilsequioxanes, benzocyclobutenes (BCB), fluorinated benzocyclobutene, polyphenylene, polysilazanes, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), fluorinated poly(arylene ether), fluorinated parylenes, poly(p-xylxylenes), fluorinated poly(p-xylxylenes), parylene F, parylene N, parylene C, parylene D, amorphous polytetrafluoroethylene, polyquinoline, polyphenylquinoxalines, polymeric photoresist materials, and the like.

Specific examples of a commercially available polymer dielectric include those under the trade designations FLARE™ from AlliedSignal, believed to be derived from perfluorobiphenyl and aromatic bisphenols; Black Diamond™ from Applied Materials; CYTOP fluoropolymer and ALCAP-S from Asahi Chemical; SiLK® and CYCLOTENE® BCB from Dow Chemical; KAPTON® polyimides and IMIDEX® polyimides available from DuPont; ZIRKON from Shipley; TEFLON® polytetrafluoroethylene from DuPont; XLK and 3MS from Dow Corning; HSG RZ25 from Hitachi Chemical; HOSP™ and NANOGLASS™ from Honeywell Electronic Materials; LKD from JSR Microelectronics; CORAL™ and AF4 from Novellus; SPINFIL™ polysilazanes and PIMEL® polyimides from Clariant; and VELOX™ PAE-2 from Schumacher.

Polymer dielectrics are typically formed using either spin-on or (chemical vapor deposition) CVD deposition techniques. In CVD, there is no organic solvent used during resist deposition. CVD includes pulsed plasma enhanced chemical vapor deposition (PECVD) and pyrolytic CVD as well as continuous PECVD. For example, plasma polymerization is a common method for depositing fluorocarbon polymer dielectrics. PECVD uses continuous radio frequency (rf) power to excite the precursor gases in order to deposit films within the glow discharge region.

The integrated circuit devices of the present invention may or may not additionally contain inorganic dielectric materials. Examples of such inorganic dielectric material include silica, silicon nitride, silicon oxynitride, other metal oxides, and the like. In one specific embodiment, the organic semiconductor devices that contain polymer dielectrics do not contain silica.

The polymer dielectric may be transparent, semi-transparent, or opaque. The polymer dielectric has a melting point or glass transition temperature that is sufficient to facilitate processing and fabrication of active semiconductor devices thereon or therein (such as forming organic semiconductor devices thereon and/or therein). In one embodiment, the polymer dielectric has a melting point and/or glass transition temperature that is about 125° C. or higher and about 425° C. or less. In another embodiment, the polymer dielectric has a melting point and/or glass transition temperature that is about 135° C. or higher and about 400° C. or less. In yet another embodiment, the polymer dielectric has a melting point and/or glass transition temperature that is about 140° C. or higher and about 300° C. or less.

In some instances, some polymer dielectrics are susceptible to the undesirable permeation of oxygen and/or moisture. In these instances, an optional moisture and/or oxygen barrier layer may be deposited on the surface of the polymer dielectric. The optional barrier layer serves to prevent at least a portion of the moisture and/or oxygen from penetrating into the polymer dielectric. Examples of barrier layers include silicon oxide, silicon nitride, nonconductive metal oxides such as aluminum oxide, alternative layers of metal/polymer such as aluminum/parylene or alternative inorganic dielectric medium/polymers such as silica/cyclotene to reduce an/or eliminate the diffusion of oxygen and moisture through the polymer dielectric. When the alternative layers of metal/polymer are employed, the top or final layer is preferably made of insulating material to prevent any possible shorting.

Examples of active devices of organic semiconductor devices and polymer memory devices include nonvolatile organic memory cells, organic semiconductor transistors, polymer semiconductor transistors, nonvolatile polymer memory cells, programmable organic memory cells, and the like. Generally, these active devices contain an organic semiconductor between two electrodes, or an organic semiconductor surrounded by three electrodes. The integrated circuit chips described herein can be employed with logic devices such as central processing units (CPUs); as volatile memory devices such as DRAM devices, as SRAM devices, and the like; with input/output devices (I/O chips); and as non-volatile memory devices such as EEPROMs, EPROMs, PROMs, and the like.

The organic memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like.

Specific examples of materials for the electrode include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

In one embodiment, the thickness of each electrode is independently about 0.01 µm or more and about 10 µm or less. In another embodiment, the thickness of each electrode is independently about 0.05 µm or more and about 5 µm or less. In yet another embodiment, the thickness of each electrode is independently about 0.1 µm or more and about 1 µm or less.

Active devices of organic semiconductor devices and polymer memory devices contain an organic semiconductor and a passive layer, which can constitute a controllably conductive media. The controllably conductive media can be rendered conductive or non-conductive in a controllable manner using an external stimuli. Generally, in the absence of an external stimuli, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, a semiconductive state, and resistive state(s) with various levels of resistance (in other words, the controllably conductive media may have a plurality of conductive states).

The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media contains one or more organic semiconductor layers and one or more passive layers. The passive layer contains a conductivity facilitating compound. In one embodiment, the controllably conductive media contains at least one organic semiconductor layer that is adjacent a passive layer (without any intermediary layers between the organic semiconductor layer and passive layer).

Organic semiconductors thus have a carbon based structure, often a carbon-hydrogen based structure, which is different from conventional MOSFETs. The organic semiconductor materials are typically characterized in that they have overlapping $\pi$ orbitals, and/or in that they have at least two stable oxidation states. The organic semiconductor materials are also characterized in that they may assume two or more resonant structures. The overlapping $\pi$ orbitals contribute to the controllably conductive properties of the controllably conductive media. The amount of charge injected into the organic semiconductor layer also influences the degree of conductivity of the organic semiconductor layer.

In this connection, the organic semiconductor layer, such as a conjugated organic polymer, has the ability to donate and accept charges (holes and/or electrons). Generally, the organic semiconductor or an atom/moiety in the polymer has at least two relatively stable states. The two relatively stable oxidation states permit the organic semiconductor to donate and accept charges and electrically interact with the conductivity facilitating compound. The ability of the organic semiconductor layer to donate and accept charges and electrically interact with the passive layer also depends on the identity of the conductivity facilitating compound.

Organic semiconductors generally include polymers with variable electric conductivity. In one embodiment, the organic semiconductor contains a conjugated organic polymer. In another embodiment, the organic semiconductor contains a conjugated organic polymer with an aromatic group within its repeating unit.

Examples of polymers with variable electrical conductivity include polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl) diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl) phenylacetylene; polydipyrrylmethane; polyindoquinone; polydihydroxyindole; polytrihydroxyindole; furane-polydihydroxyindole; polyindoquinone-2-carboxyl; polyindoquinone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly (germaniumoxohemiporphyrazine); poly(ethylenedioxythiophene); polymetallocene complexes (Fe, V, Cr, Co, Ni and the like); polypyridine metal complexes (Ru, Os and the like); and the like.

In one embodiment, the organic semiconductor layer is not doped with a salt. In another embodiment, the organic semiconductor layer is doped with a salt. A salt is an ionic compound having an anion and cation. General examples of salts that can be employed to dope the organic semiconductor layer include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

In one embodiment, the organic semiconductor layer has a thickness of about 0.001 μm or more and about 5 μm or less. In another embodiment, the organic semiconductor layer has a thickness of about 0.01 μm or more and about 2.5 μm or less. In yet another embodiment, the organic semiconductor layer has a thickness of about 0.05 μm or more and about 1 μm or less.

The organic semiconductor layer may be formed by spin-on techniques (depositing a mixture of the polymer/polymer precursor and a solvent, then removing the solvent from the substrate/electrode), by chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). During formation or deposition, the organic semiconductor material self assembles between the electrodes. It is not typically necessary to functionalize one or more ends of the organic polymer in order to attach it to an electrode/passive layer.

A covalent bond may be formed between the organic semiconductor material and the passive layer. Alternatively, close contact is required to provide good charge carrier/electron exchange between the organic semiconductor layer and the passive layer. The organic semiconductor layer and the passive layer are electrically coupled in that charge carrier/electron exchange occurs between the two layers.

A passive layer contains at least one conductivity facilitating compound that contributes to the controllably conductive properties of the controllably conductive media. The conductivity facilitating compound, formed by implantation, has the ability to donate and accept charges (holes and/or electrons) and/or act as a source of copper ions. The passive layer thus may transport holes, electrons, and/or ions between an electrode and the organic polymer layer/passive layer interface, facilitate charge/carrier injection into the organic polymer layer, and/or increase the concentration of a charge carrier (ions, holes and/or electrons) in the organic polymer layer. In some instances, the passive layer may store opposite charges thereby providing a balance of charges in the organic memory device as a whole. Storing charges/charge carriers is facilitated by the existence of two relatively stable oxidation states for the conductivity facilitating compound.

The fermi level of the passive layer is close to the valence band of the organic semiconductor layer. Consequently, the injected charge carrier (into the organic semiconductor layer) may recombine with the charge at the passive layer if the energy band of the charged organic semiconductor layer does not substantially change. Positioning energy bands involves compromising between ease of charge injection and length of charge (data) retention time.

The applied external field can reduce the energy barrier between the passive layer and organic layer depending on the field direction. Therefore, enhanced charge injection in the forward direction field in programming operation and also enhanced charge recombination in reversed field in erase operation can be obtained.

The passive layer may in some instances act as a catalyst when forming the organic semiconductor layer, particularly when the organic semiconductor layer contains a conjugated organic polymer. In this connection, the polymer backbone of the conjugated organic polymer may initially form adjacent the passive layer, and grow or assemble away and substantially perpendicular to the passive layer surface. As a result, the polymer backbones of the organic polymers may be self aligned in a direction that traverses the electrodes or in a direction away from the passive layer.

Examples of conductivity facilitating compounds that may constitute the passive layer include one or more of copper sulfide ($Cu_2S$, CuS), copper rich copper sulfide ($Cu_3S$, CuS; $Cu_3S$, $Cu_2S$,), copper oxide (CuO, $Cu_2O$), copper selenide ($Cu_2Se$, CuSe), copper telluride ($Cu_2Te$, CuTe), manganese oxide ($MnO_2$), titanium dioxide ($TiO_2$), indium oxide ($I_3O_4$), silver sulfide ($Ag_2S$, AgS), gold sulfide ($Au_2S$, AuS), iron oxide ($Fe_3O_4$), cobalt arsenide ($CoAs_2$), nickel arsenide (NiAs), and the like. The conductivity facilitating compounds do not necessarily dissociate into ions under the strength of the electric field, although ions may move through them. The passive layer may contain two or more subpassive layers, each sublayer containing the same, different, or multiple conductivity facilitating compounds.

The passive layer is grown using oxidation techniques, formed via gas phase reactions, implantation techniques, or deposited on/between electrodes. In some instances, to promote long charge retention times (in the organic semiconductor layer), the passive layer may be treated with a plasma after it is formed. The plasma treatment modifies the energy barrier of the passive layer.

In one embodiment, the passive layer containing the conductivity facilitating compound has a thickness of about 2 Å or more and about 0.1 μm or less. In another embodiment, the passive layer has a thickness of about 10 Å or more and about 0.01 μm or less. In yet another embodiment, the passive layer has a thickness of about 50 Å or more and about 0.005 μm or less.

Operation of the organic memory devices/cells is facilitated using an external stimuli to achieve a switching effect. The external stimuli include an external electric field and/or light radiation. Under various conditions, the organic memory cell is either conductive (low impedance or "on" state) or non-conductive (high impedance or "off" state).

The organic memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information.

Switching the organic memory cell to the "on" state from the "off" state occurs when an external stimuli such as an applied electric field exceeds a threshold value. Switching the organic memory cell to the "off" state from the "on" state occurs when an external stimuli does not exceed a threshold value or does not exist. The threshold value varies depending upon a number of factor including the identity of the materials that constitute the organic memory cell and the passive layer, the thickness of the various layers, and the like.

Generally speaking, the presence of an external stimuli such as an applied electric field that exceeds a threshold value ("programming" state) permits an applied voltage to write or erase information into/from the organic memory cell and the presence of an external stimuli such as an applied electric field that is less than a threshold value permits an applied voltage to read information from the organic memory cell; whereas external stimuli that do not exceed a threshold value do not write or erase information into/from the organic memory cell.

To write information into the organic memory cell, a voltage or pulse signal that exceeds the threshold is applied. To read information written into the organic memory cell, a voltage or electric field of any polarity is applied. Measuring the impedance determines whether the organic memory cell is in a low impedance state or a high impedance state (and thus whether it is "on" or "off"). To erase information written into the organic memory cell, a negative voltage opposite in polarity to the writing signal, that exceeds a threshold value, is applied.

Referring to FIG. 1, a brief description of a microelectronic organic memory device 100 containing a plurality of organic memory cells positioned on or over a substrate 101 in accordance with one aspect of the invention is shown, as well as an exploded view 102 of an exemplary organic memory cell 104. The microelectronic organic memory device 100 contains a desired number of organic memory cells, as determined by the number of rows, columns, and layers (three dimensional orientation described later) present positioned on a substrate 101. The organic memory cells are formed in a polymer dielectric 103. The first electrodes 106 and the second electrodes 108 are shown in substantially perpendicular orientation, although other orientations are possible to achieve the structure of the exploded view 102. Each organic memory cell 104 contains a first electrode 106 and a second electrode 108 with a controllably conductive media 110 therebetween. The controllably conductive media 110 contains an organic semiconductor layer 112 and passive layer 114. Peripheral circuitry and devices are not shown for brevity.

Figure 2:
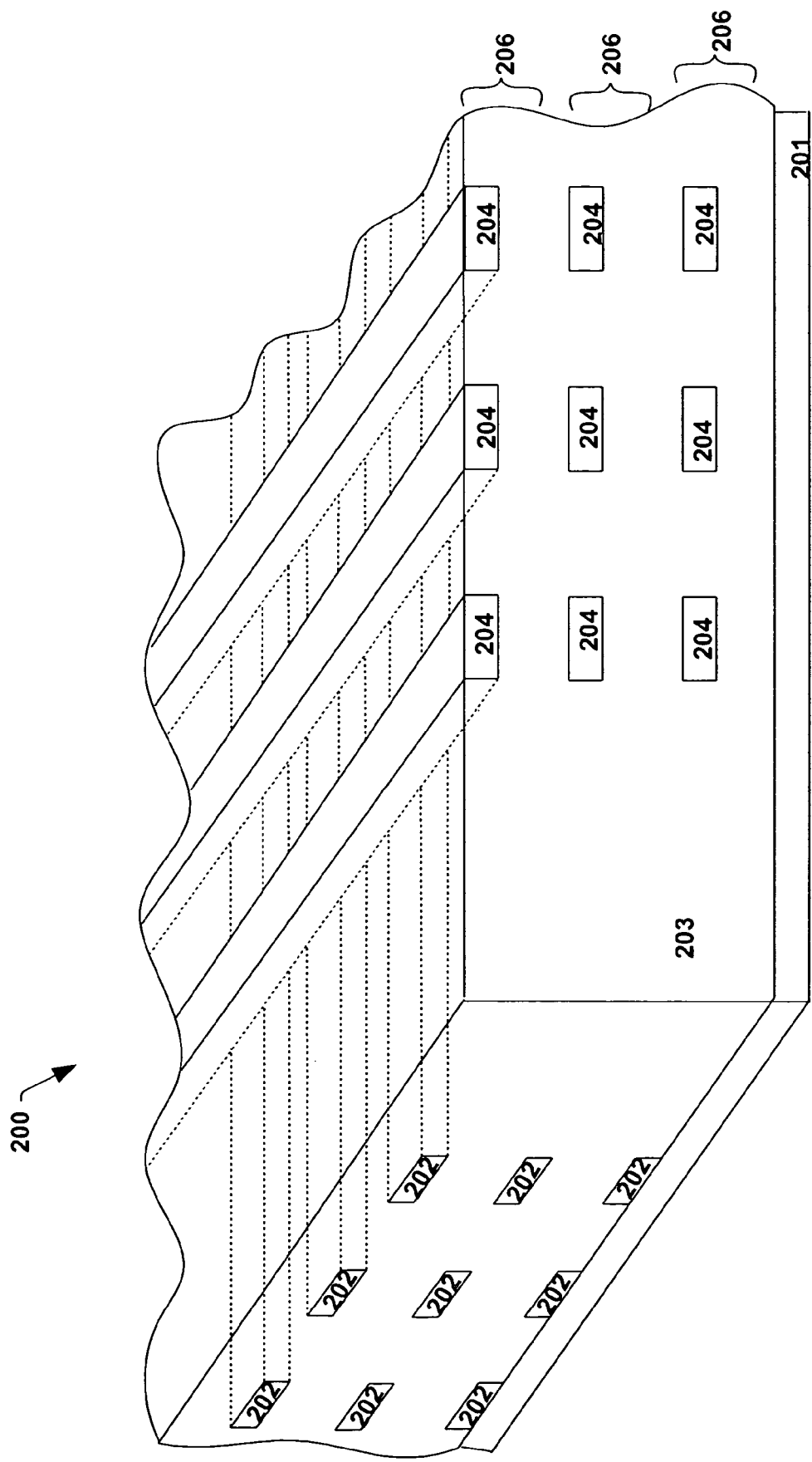
FIG. 2 illustrates a perspective view of a three dimensional microelectronic device containing a plurality of organic memory cells within a polymer dielectric in accordance with another aspect of the invention.

Referring to FIG. 2, a three dimensional microelectronic organic memory device 200 containing a plurality of organic semiconductor devices on/over a substrate 201 in accordance with an aspect of the invention is shown. The three dimensional microelectronic organic memory device 200 contains a plurality of first electrodes 202, a plurality of second electrodes 204, and a plurality of memory cell layers 206 formed within a polymer dielectric 203. Between the respective first and second electrodes are the controllably conductive media (not shown). The plurality of first electrodes 202 and the plurality of second electrodes 204 are shown in substantially perpendicular orientation, although other orientations are possible. The microelectronic organic memory device has relatively light weight owing to polymer dielectrics and organic memory devices (instead of relatively heavy inorganic transistors and inorganic dielectrics) and the polymer dielectrics and organic memory devices have relatively matched coefficients of thermal expansion since both are organic based materials. In FIG. 2, peripheral circuitry and devices are not shown for brevity.

Figure 3:
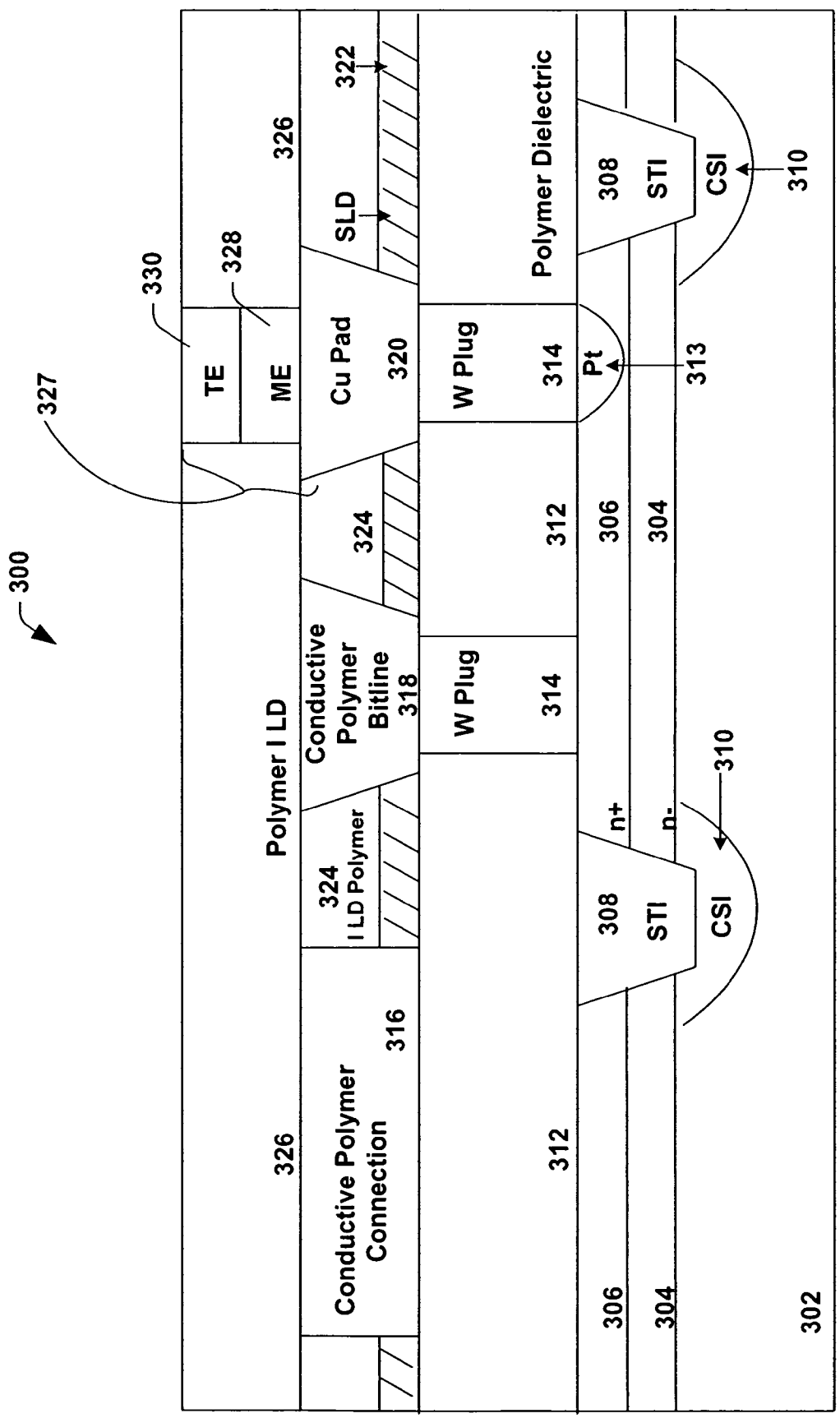
FIG. 3 is a cross sectional illustration of one aspect of an integrated circuit device containing a plurality of organic semiconductor devices and polymer dielectrics in accordance with the present invention.

The present invention may be further understood and its advantages further appreciated in conjunction with FIG. 3. A multifunctional semiconductor device 300 is shown with polymer dielectric structures 312, 322, 324, and 326 (and optionally 308 as a polymer dielectric structure) therein. The multifunctional semiconductor device 300 has, supported on/by the substrate 302, an n-doped region 304, and n+ doped region 306, with shallow trench isolation (STI) regions 308 formed therein. STI regions 308 may be formed of a polymer dielectric or an inorganic dielectric such as silica. Underneath the STI regions 308 are formed channel stop implant (CSI) regions 310. A first polymer dielectric structure 312 is positioned over the n+ doped region 306. Within the first polymer dielectric structure 312 are tungsten plugs 314. The tungsten plugs 314 may be formed using a damascene or dual damascene process, amongst other available fabrication techniques. A p+ region 313 underlies the tungsten plug 314.

A second polymer dielectric structure or stop layer dielectric (SLD) 322 is positioned over the first polymer dielectric structure 312. The SLD 322 may contain the same or different material as the first polymer dielectric structure 312, but preferably a different material. A third polymer dielectric structure 324 is positioned over the SLD 322. The third polymer dielectric structure 324 may contain the same or different material as the first polymer dielectric structure 312 and/or the SLD 322, but preferably a different material the SLD 322 and the same material as the first polymer dielectric structure 312. Within the third polymer dielectric structure 324 are formed conductive polymer connection structure 316, conductive polymer bitline 318, and copper pad 320. Alternatively, one or both of the conductive polymer connection structure 316 and the conductive polymer bitline 318 may be formed of a metallic conductive material.

A fourth polymer dielectric structure or polymer interlayer dielectric (ILD) 326 is positioned over the third polymer dielectric structure 324. The ILD 326 may contain the same or different material as the first polymer dielectric structure 312, third polymer dielectric structure 324, and/or the SLD 322. Within ILD 326 is formed a portion of a polymer memory cell 327. Specifically, a polymeric organic semiconductor material 328 is formed over the copper pad 320, and a top electrode 330 is formed over the polymeric organic semiconductor material 328. Additional layers may be formed over the ILD 326, but they are not shown for brevity.

In the multifunctional semiconductor device 300, the first polymer dielectric structure 312, the SLD, 322, the third polymer dielectric structure 324, the conductive polymer connection structure 316, the conductive polymer bitline 318, and the ILD 326 provide light weight and relatively matched coefficients of thermal expansion, thereby improving the reliability and usefulness of the device 300.

The organic semiconductor devices with polymer dielectrics are useful in any device requiring memory. For example, the organic semiconductor devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices and polymer dielectrics. Examples of hand-held devices include cell phones and other two way communication devices, personal data assistants, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A semiconductor device, comprising:
   a substrate;
   a polymer dielectric over the substrate; and
   at least one active device comprising an organic semiconductor material and a passive layer,
   wherein coefficients of thermal expansion of the polymer dielectric and organic semiconductor material are substantially matched.

2. The semiconductor device of claim 1, wherein the polymer dielectric comprises at least one selected from the group consisting of polyimides, fluorinated polyimides, polysilsequioxanes such as hydrogen polysilsequioxanes, methyl polysilsequioxanes, butyl polysilsequioxanes, and phenyl polysilsequioxanes, benzocyclobutenes (BCB), fluorinated benzocyclobutene, polyphenylene, polysilazanes, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), fluorinated poly(arylene ether), fluorinated parylenes, poly(p-xylxylenes), fluorinated poly(p-xylxylenes), parylene F, parylene N, parylene C, parylene D, amorphous polytetrafluoroethylene, polyquinoline, polyphenylquinoxalines, and polymeric photoresist materials.

3. The semiconductor device of claim 1, wherein the polymer dielectric comprises a self patternable material.

4. The semiconductor device of claim 1, wherein the polymer dielectric has a glass transition temperature or a melting point of about 125° C. or higher and about 425° C. or less.

5. The semiconductor device of claim 1, wherein the polymer dielectric has a dielectric constant below about 3.

6. The semiconductor device of claim 1 further comprising a conductive polymer.

7. The semiconductor device of claim 1, wherein the organic semiconductor material comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl) diphenylacetylene; poly(carbazole) diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl)phenylacetylene; polydipyrrylmethane; polyindoquinone; polydihydroxyindole; polytrihydroxyindole; furane-polydihydroxyindole; polyindoquinone-2-carboxyl; polyindoquinone; polybenzobisthiazole; poly(p-phenylene sulfide); polyaniline: polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

8. The semiconductor device of claim 1, wherein the passive layer comprises at least one selected from the group consisting of copper sulfide, copper rich copper sulfide, copper oxide, copper selenide, copper telluride, manganese oxide, titanium dioxide, indium oxide, silver sulfide, gold sulfide, iron oxide, cobalt arsenide, and nickel arsenide.

9. The semiconductor device of claim 1, wherein at least one active device comprises a first and a second electrode, a passive layer adjacent the first electrode, and the organic semiconductor material adjacent the second electrode.

10. The semiconductor device of claim 1, further comprising two electrodes, wherein the active device is between the two electrodes.

11. The semiconductor device of claim 10, wherein the polymer dielectric comprises at least one selected from the group consisting of polyimides, fluorinated polyimides, polysilsequioxanes such as hydrogen polysilsequioxanes, methyl polysilsequioxanes, butyl polysilsequioxanes, and phenyl polysilsequioxanes, benzocyclobutenes (BCB), fluorinated benzocyolobutene, polyphenylene, polysilazanes, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), fluorinated poly(arylene ether), fluorinated parylenes, poly(p-xylxylenes), fluorinated poly(p-xylxylenes), parylene F, parylene N, parylene C, parylene D, amorphous polytetrafluoroethylene, polyquinoline, polyphenylquinoxalines, and polymeric photoresist materials.

12. The semiconductor device of claim 10, wherein the polymer dielectric has a glass transition temperature or a melting point of about 135° C. or higher and about 400° C. or less.

13. The semiconductor device of claim 10, wherein the polymer dielectric has a dielectric constant below about 2.4.

14. The semiconductor device of claim 10, wherein the polymer dielectric is formed by one of spin-on techniques and chemical vapor deposition techniques.

15. The semiconductor device of claim 10, wherein the organic semiconductor material comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl) diphenylacetylene; poly(carbazole) diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl) phenylacetylene; poly(trimethylsilyl)phenylacetylene; polydipyrrylmethane; polyindoquinone; polydihydroxyindole; polytrihydroxyindole; furane-polydihydroxyindole; polyindoquinone-2-carboxyl; polyindoquinone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

16. The semiconductor device of claim 10, wherein the passive layer comprises at least one selected from the group consisting of copper sulfide, copper rich copper sulfide, copper oxide, copper selenide, copper telluride, manganese oxide, titanium dioxide, indium oxide, silver sulfide, gold sulfide, iron oxide, cobalt arsenide, and nickel arsenide.

17. A semiconductor device, comprising:
   a substrate;
   a polymer dielectric over the substrate;
   at least one active device comprising an organic semiconductor material and a passive layer; and
   a conductive polymer adjacent at least one active device, wherein coefficients of thermal expansion of the polymer dielectric and organic semiconductor material are substantially matched.

18. The semiconductor device of claim 17, wherein the polymer dielectric has a glass transition temperature or a melting point of about 125° C. or higher and about 425° C. or less and a dielectric constant below about 3.

19. The semiconductor device of claim 17, wherein the polymer dielectric comprises at least one selected from the group consisting of polyimides, fluorinated polyimides, polysilsequioxanes such as hydrogen polysilsequioxanes, methyl polysilsequioxanes, butyl polysilsequioxanes, and phenyl polysilsequioxanes, benzocyclobutenes (BCB), fluorinated benzocyclobutene, polyphenylene, polysilazanes, polyphenylquinoxaline, copolymers of 2,2-bistrifluoromethyl-4,5-difluoro-1,3-dioxole, perfluoroalkoxy resin, fluorinated ethylene propylene, fluoromethacrylate, poly(arylene ether), fluorinated poly(arylene ether), fluorinated parylenes, poly(p-xylxylenes), fluorinated poly(p-xylxylenes), parylene F, parylene N, parylene C, parylene D, amorphous polytetrafluoroethylene, polyquinoline, polyphenylquinoxalines, and polymeric photoresist materials.

20. The semiconductor device of claim 17, wherein the active device comprises a polymer memory device comprising the organic semiconductor material and the passive layer between two electrodes, the organic semiconductor material comprising a conjugated polymer.

* * * * *